(12) United States Patent
Jaquette

(10) Patent No.: US 6,218,970 B1
(45) Date of Patent: *Apr. 17, 2001

(54) LITERAL HANDLING IN LZ COMPRESSION EMPLOYING MRU/LRU ENCODING

(75) Inventor: Glen Alan Jaquette, Tucson, AZ (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/152,067

(22) Filed: Sep. 11, 1998

(51) Int. Cl.[7] ....................................................... H03M 7/00
(52) U.S. Cl. ................................ 341/106; 341/51; 341/63
(58) Field of Search ................................ 341/106, 63, 51, 341/55, 56, 84, 82; 364/243.41; 710/68

(56) References Cited

U.S. PATENT DOCUMENTS

| | | | |
|---|---|---|---|
| 4,906,991 | 3/1990 | Fiala et al. | 341/51 |
| 5,247,638 | * 9/1993 | O.Brien et al. | 341/87 |
| 5,412,384 | 5/1995 | Chang et al. | 341/79 |
| 5,450,562 | * 9/1995 | Rosenberg et al. | 341/55 |
| 5,534,861 | 7/1996 | Chang et al. | 341/79 |
| 5,652,878 | * 7/1997 | Craft | 341/55 |
| 5,689,255 | * 11/1997 | Frazier et al. | 341/63 |

* cited by examiner

Primary Examiner—Peguy JeanPierrre
Assistant Examiner—Jean Brumer JeanGlaude
(74) Attorney, Agent, or Firm—John H. Holcombe; Robert M. Sullivan

(57) ABSTRACT

A method and system for handling literals in a Lempel-Ziv data compression system. The literals are arranged in a storage array in an MRU/LRU format in a defined sequential MRU/LRU order, with shorter MRU/LRU reference codes assigned to the MRU literals and longer MRU/LRU reference codes to the LRU literals. Upon receiving an input literal, a selector selects the literal and a reference encoder provides the assigned MRU/LRU reference code for the literal as the output. The literals are then rearranged. An incrementor responds to the literal selection, by incrementing downward one location in the sequential order, all the literals in the storage array from the top of the MRU order to the one of the literals in the order immediately preceding the selected literal, and the selector moves the selected literal to the top of the MRU order.

19 Claims, 3 Drawing Sheets

LITERAL HANDLING IN LZ COMPRESSION EMPLOYING MRU/LRU ENCODING

TECHNICAL FIELD

This invention relates to Lempel-Ziv data compression, and, more particularly, to the handling of literals which are not output as part of a string match during the data compression process.

BACKGROUND OF THE INVENTION

With the continued growth in demand for data transmission and data storage capacities, improved lossless data compression techniques are continually sought. As described in coassigned U.S. Pat. No. 5,652,878, of the many classes of lossless data compression, one of the most useful is the class of dictionary based compression techniques. Among these, the most useful today are the so-called Ziv-Lempel variable-length encoding procedures ascribed to J. Ziv and A. Lempel who suggested the "LZ1" length offset encoding scheme. The LZ1 process uses a fixed size sliding "history" window into the past source data string as the dictionary. Matches are encoded as a "match length" and an "offset" from an agreed position.

Because LZ1 scrolls the source string over a fixed sized sliding history window to create an adaptive dictionary, identification of duplicate "matching" strings in the source data is at first difficult, but becomes very efficient. Once a matching string is encoded as a "length" and "offset", the necessary decoding process is rapid and efficient, requiring no dictionary preload. The '878 patent illustrates an LZ1 compression technique which has been denominated the "adaptive lossless data compression" technique, or "ALDC".

All sliding window data compression processes suffer from what may be called "start-up losses" and "non-redundancy losses" in compression efficiency and corresponding increases in entropy. Because each source string or block begins with an empty "dictionary", the first source symbol must be passed through as a raw word without compression, and begins building the dictionary. Similarly, a string of input data which has already been encrypted or compressed and lacks substantial redundancy, will likely lack the matches required to achieve compression, and these source symbols must also be passed through as raw words without compression. The raw words must be identified as such, however, thereby leading to an expansion of the data.

Only after accumulating a substantial dictionary, by having the sliding window fill up with input data having substantial redundancy, are matches found for increasing numbers of substrings which allow encoding efficiency to build up.

In the original LZ1 arrangement, called "LZ77", all source input is output in the form of a three part token having the length and offset together with a flag, which is the first character of the compressed substring. Techniques such as ALDC overcome the problem when a non-redundant character is encountered by not sending the three part token, but instead providing the character unchanged, called a "literal", and providing it with a designation to indicate that it is not compressed. A typical designation is an added "zero" bit for each word of the source string. Thus, when encountering a string of non-redundant input data, the compression is expanded by a much smaller length than is likely with the original LZ1 technique. However, LZ1 techniques such as ALDC still must actually expand the data by one bit for every word, typically a 9/8 expansion to output them as literals.

Because of this problem, alternative compression techniques have been designed to offer special advantages in particular circumstances. An example is LZ2 compression (also known as LZ78 or the related version known as LZW) which captures redundancies and maintains them in a dictionary for, e.g., an entire record, as described in "The Data Compression Book", M. Nelson, M & T Publishing, 1991, pp. 277–311. Thus, the opportunity for having redundancies is expanded, albeit at the cost of an expanded dictionary buffer.

SUMMARY OF THE INVENTION

It is an object of the present invention to handle literals so as to reduce the likely expansion of the resultant output.

Disclosed are a method and system for handling literals in a Lempel-Ziv data compression system. The literals are arranged in a storage array in an MRU/LRU format in a defined sequential MRU/LRU order, with shorter MRU/LRU reference codes assigned to the MRU literals and longer MRU/LRU reference codes to the LRU literals. Upon receiving an input literal, a selector selects the literal and a reference encoder provides the assigned MRU/LRU reference code for the literal as the output. If the literal is not already at the top of the MRU/LRU format stack, the literals are then rearranged. An incrementor is responsive to the literal selection, for incrementing downward one location in the sequential order, all of the literals in the storage array from the top of the MRU order to the literal immediately preceding the selected literal, and the selector moves the selected literal to the top of the MRU order.

For a fuller understanding of the present invention, reference should be made to the following detailed description taken in conjunction with the accompanying drawings.

DETAILED DESCRIPTION OF THE INVENTION

This invention is described in preferred embodiments in the following description with reference to the Figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

Figure 1:
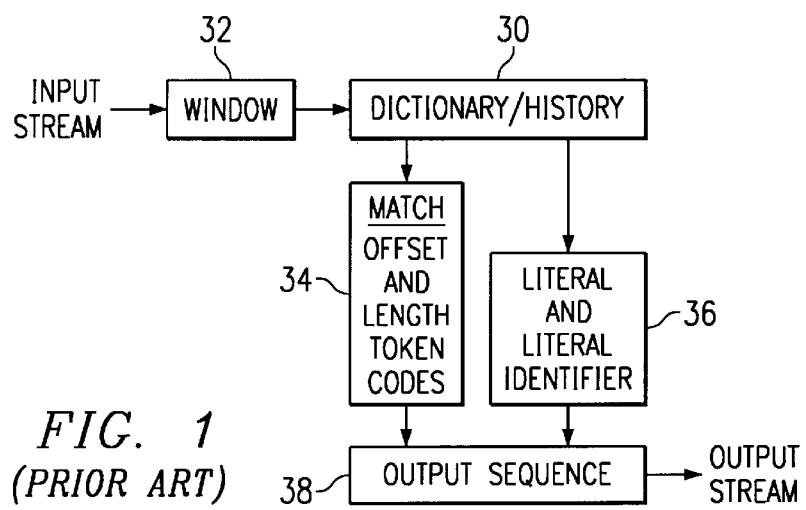
FIG. 1 is a block diagram of a sliding window LZ1 data compression system of the prior art.

Referring to FIG. 1, the prior art LZ1 compression procedure replaces a redundant substring of source symbols with a pointer to an earlier occurrence of the same substring. Data compression occurs because the pointer representation is coded to fewer bits than the replaced source symbol substring. In the simplified example of FIG. 1, the scheme employs a history buffer 30 and a look ahead buffer 32, typically with a smaller capacity than the history buffer. The first encoder task is to find the longest prefix match of the string in the look ahead buffer 32 that has an exact match in buffer 30. The length of the longest match is one part of the token provided by the encoder, and the position or offset in buffer 30 where the match is located is the other part of the token provided by the encoder. In FIG. 1, a flag bit, the length and offset token codes for the matches are provided by logic 34. In another version of LZ-1, for example, the LZ2 mode, discussed above, the dictionary 30 may contain entries of strings which occurred further back than the sliding history window length. Therefore, the potential for compression is increased. The processing time is also reduced for matches to the dictionary since the entire history buffer need not be searched. Once the input data changes in nature (e.g., numbers instead of words), matches to the history buffer (dictionary) are found less frequently, thus the LZ2 mode compression efficiency is reduced.

As described above, the flag bit is required to distinguish between encoded output and a literal. Thus, each compressed data token has an added "1" flag bit. Those characters (typically, bytes) that are not part of a matched string are output as "literals". A literal is created by having logic 36 prepend a "0" bit to the byte.

The compressed flag, length and offset codes are supplied by logic 34 to a sequencer 38, as are the literals and flags of logic 36.

Therefore, every literal in the LZ-1 format expands the input data. For example, in the ALDC format, the expansion is by 1 bit for every 8 bit byte, an expansion of 12.5%.

The present invention is directed to the handling of the literals so as to reduce the likely expansion of the output.

Figure 2:
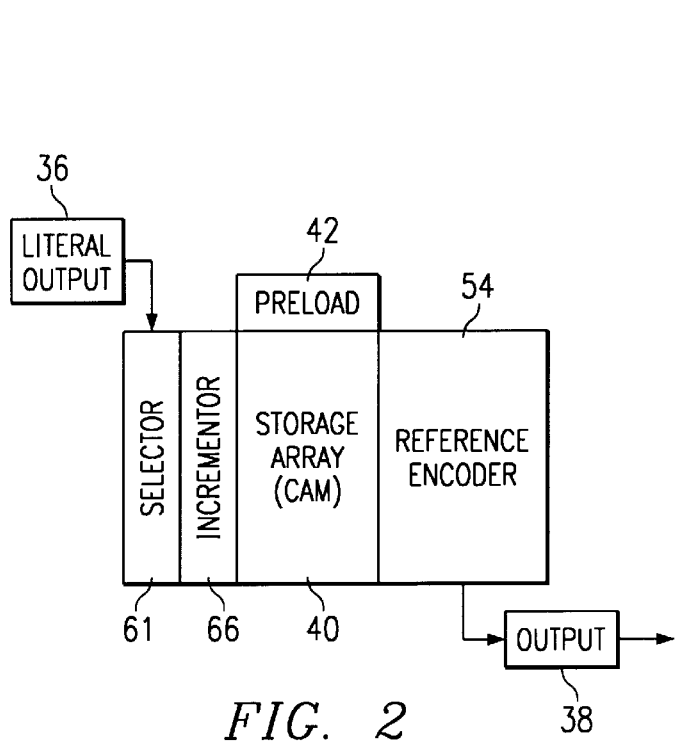
FIG. 2 is a block diagram of an embodiment of a system of the present invention for handling literals in a Lempel-Ziv data compression system, e.g., of FIG. 1.
Figure 3:
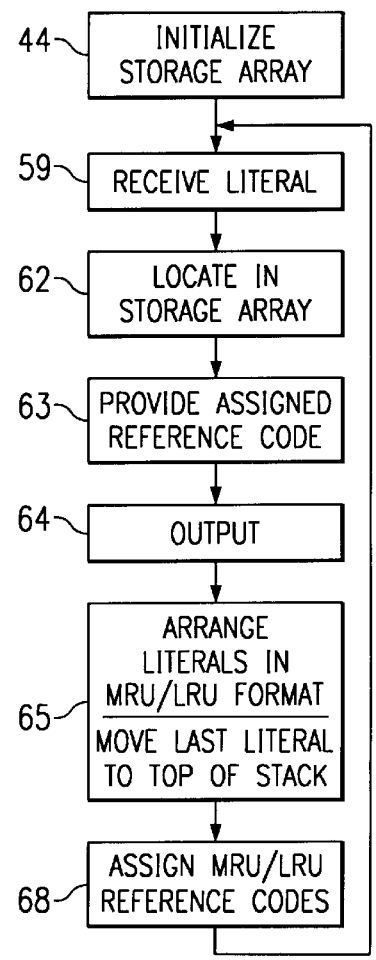
FIG. 3 is a flow chart depicting a method of the present invention for handling literals of the system of FIG. 2.

Referring to FIGS. 2 and 3, the literals are arranged in a storage array 40 in a most recently used (MRU)/least recently used (LRU) format in a defined sequential MRU/LRU order, with shorter MRU/LRU reference codes assigned to the MRU literals and longer MRU/LRU reference codes to the LRU literals, the encoded output provided by reference encoder 54. It is preferable to initialize the storage array 40 with a defined preload 42 in step 44. The preload may comprise a preset state of the register, initialized at a Reset input. Alternatively, a preload device 42 may comprise, for example, a ROM. The 8 bits comprise all 256 possible combinations of bits representing 256 possible characters. Every possible value of the 256 must be preset to one of the 256 registers, i.e., each must be unique. The characters are typically coded in a standard communication code, such as EBCDIC (extended binary coded decimal interchange code).

Thus, an example of an MRU/LRU preload ordering is to have a first MRU group and a second MRU group, e.g., of 64 characters each, and a LRU group of 128 characters. In the example, the characters representing the alphabetic characters in lower case, representing the most common of the alphabetic characters in upper case, representing the numerals, and representing the most common punctuation may be the first set of MRU characters and assigned the shortest reference codes. The remainder of the upper case alphabetic characters, punctuation and normally expected special characters, such as "&" may be included in the next MRU group. The LRU group may be special language characters, special mathematical characters, etc.

The present invention will then continually modify the preload by moving the last literal encountered to the top of the MRU stack.

Figure 4:
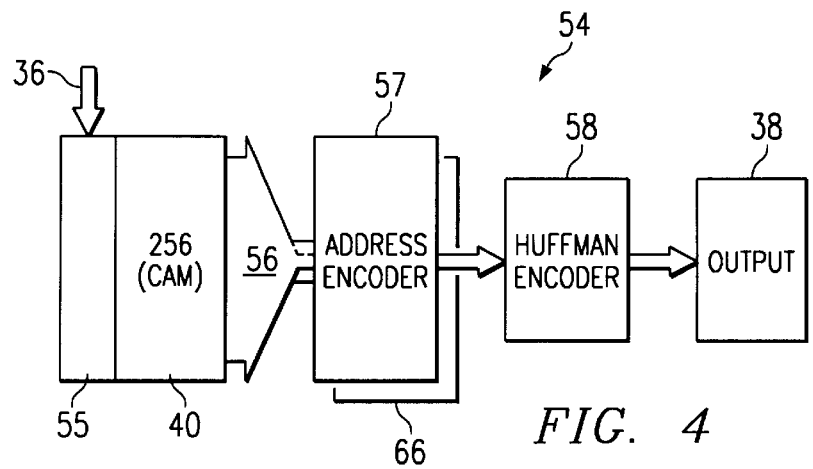
FIG. 4 is a an embodiment of a reference encoder of the system for handling literals of FIG. 2.

One embodiment of a reference encoder 54 is illustrated in FIG. 4. The literal data byte from logic 36 to be encoded is put on an eight bit wide data bus 55 to the CAM array 40. The CAM array acts as a selector by outputting a bit at each of the 256 CAM cells on bus 56 indicating whether the cell matches the content of the bus 55. Thus, there are 255 inactive CAM outputs and one active CAM output. An example of a storage array and selector comprises a content addressable memory (CAM) such as described in the above '878 patent.

An address encoder 57 outputs the address of the single active CAM cell. Then, an encoder 58, such as a Huffman encoder, encodes the first bits of the address from address encoder 57.

Specifically, in one example, encoder 58 may prepend "00" bits to the remaining 6 bits of the address for the first MRU group, the first "0" bit indicating a literal. Encoder 58 may prepend "010" to the remaining 6 bits of the address for the second MRU group. Encoder 58 prepends "011" for the first bit of the address of the LRU group, expanding the symbol to 7 address and 3 prepended bits, for a total of 10 bits.

Thus, in the illustrated example, the most recently used (MRU) literals are encoded into a compressed symbol only 8 bits in length. On the assumption that the MRU literals are also likely to be the literals that will appear again as literals in the sequence, the likely expansion of the output data beyond the 8 bits is substantially reduced.

Referring again to FIGS. 2 and 3, the literal is received from literal logic of FIG. 1 in step 59. Upon receiving an input literal, a selector 61 selects the literal in step 62 by locating the literal in the storage array 40. Selector 61 may comprise the bus 55 and CAM array of FIG. 4.

In step 63 the reference encoder 54 provides the assigned MRU/LRU reference code for the literal. As described above with respect to FIG. 4, the MRU/LRU reference code is the address of the location of the literal together with the added precursor bits from encoder 58. The assigned reference code of step 63 is provided at output sequencer 38 for transmission in the sequence of output data in step 64.

If the literal is not already at the top of the MRU/LRU format stack, the literals are then rearranged in step 65. An incrementor 66 is responsive to the literal selection by selector 61, and increments downward one location in the sequential order, all of the literals in the storage array from the top of the MRU order to the one of the literals in the order immediately preceding the selected literal, and the selector 61 moves the selected literal to the top of the MRU order. If the storage array 40 is implemented as a shift register, incrementor 66 may be implemented as gating logic to shift each of the literals along the shift register downward one location, only at the locations between the top of the stack and the location of the literal.

In other words, the selected literal character may be considered as leaving a "hole" in the storage array as it is being moved to the top of the stack. All the literals in the stack above the hole, including the literal at the preexisting top of the stack, are therefore incremented downward one location, filling the hole. The selected literal is then located at the top of the MRU stack.

The new incremented locations of the literals therefore determines the assigned reference codes of step 68.

The method then cycles back to step 59 to receive the next input.

Figure 5:
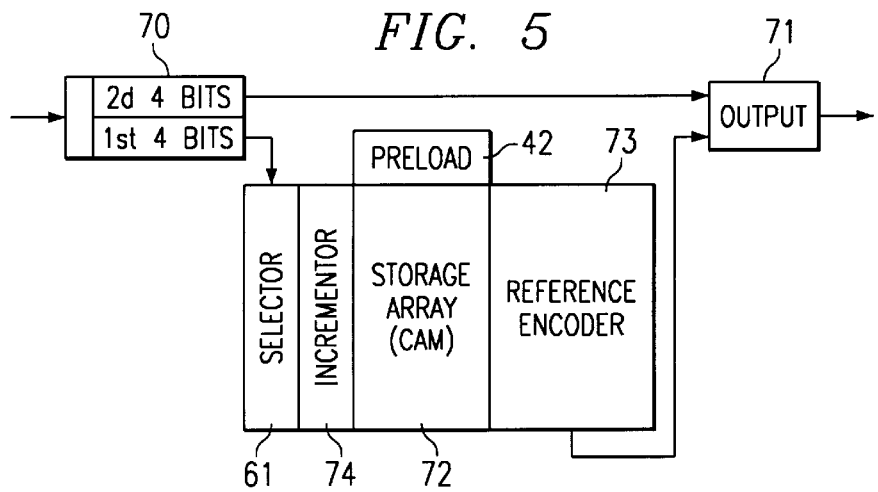
FIG. 5 is a block diagram of an alternative embodiment of a system of the present invention for handling literals.

An alternative embodiment of a system of the present invention for handling literals is illustrated in FIG. 5, which may employ the method described with respect to the flow diagram of FIG. 3.

In the embodiment of FIG. 5, a literal detector 70, separates the first and second 4-bit segments of the literal, providing the second segment to an output sequencer 71 and the first 4-bit segment to the selector 61. By utilizing only 4 bits of the literal, the storage array 72 may be significantly smaller, specifically 16 locations rather than 256. The first MRU group may therefore comprise only 4 locations, the second MRU group 4 locations, and the LRU group 8 locations.

Referring to FIGS. 3 and 5, the input characters are received by a literal detector 70 in step 59. The 2d 4 bits must be delay matched to the circuit (calculation) delays encountered by the 1st 4 bits, so that an output 71 combines the encoded 1st 4 bits with the 2d 4 bits. Thus, the literal detector 70 delays and transmits the 2d 4 bits of the literal to output 71. The selector 61 locates, in step 62, the first 4 bits of the literal character in storage array 72. The reference encoder 73, in step 63, provides the encoded address of the 4 bits of the literal and the "00", "010" or "011" indications to the output 71, where it is combined with the last 4 bits of the input literal and output, in step 64. Specifically, the address of each four bit word is either "00ab", "01cd", or "1efg", which Huffman encode to "0ab", "10cd", or "11efg", respectively, to which is added the "0" literal flag bit. The selector 61 and an incrementor 74 move the selected 4-bit literal to the top of the stack, so the selected literal character leaves a "hole" in the storage array, in accordance with step 65. All the literals in the stack above the hole, including the literal at the preexisting top of the stack, are incremented downward one location, filling the hole. Again, the location of the 4-bit literals after the rearrangement results in the step 68 assignment of the 16 MRU/LRU reference codes based on location, and the next input character is awaited.

Those of skill in the art appreciate that many different means may be employed to accomplish the rearrangement of the literals and the assignment of the reference codes, for example, by addressing in a software implementation.

Those of skill in the art also recognize that other storage array capacities and numbers of locations for the first MRU, second MRU and LRU groups, and resultant bit length for the location addresses, may be utilized. For example, a 128×7 CAM array will work for 128 MRU/LRU entries and utilize the addresses to encode into 7–9 bits, including the flag bit.

Other types of reference encoders 54 or 73 may alternatively be employed for assigning reference codes to the literals. For example, directly wired (or microcode) encoding may be employed which assigns shorter MRU/LRU reference codes to MRU literals and longer MRU/LRU reference codes to LRU literals.

As one example, eight bit literals could be encoded as follows, to which the 0 literal flag is prepended:

If the MRU address is 0000.0000 to 0000.1111 (first 16) output as 00.xxxx (6 bits)

If the MRU address is 00.010000 to 00.101111 (next 32) output as 01.xxxxx (7 bits)

If the MRU address is 0.0110000 to 0.1111111 (next 64) output as 10.xxxxxx (8 bits)

If the MRU address is 10000000 to 10001111 (next 16) output as 110.xxxx (7 bits)

If the MRU address is 01110000 to 11101111 (next 128) output as 111.xxxxx (10 bits).

As another example, 16 bit words could be encoded by employing any of the above methods for encoding the first 8 bits of each word, and simply appending the second 8 bits.

Figure 6:
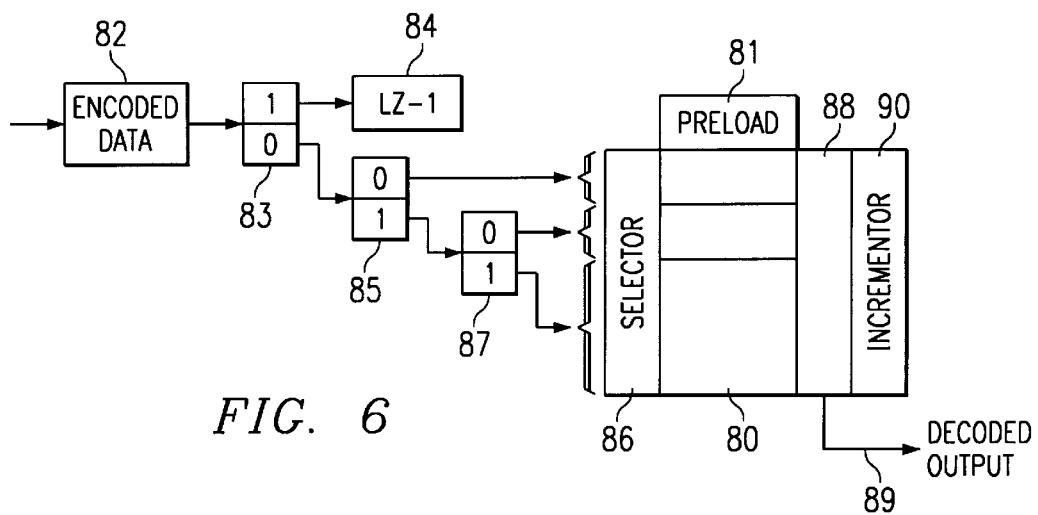
FIG. 6 is a block diagram of an embodiment of a decoder for handling literals in accordance with the present invention.

An embodiment of a decoder is illustrated in FIG. 6. The decoder also includes a storage array 80, which is addressed by location and need not be a CAM. As an alternative, a CAM may be employed without moving the characters, but by employing the "location addresses" as the CAM. It is necessary to preload the storage array 80 from a preload device 81, such as a ROM, with the identical preload as the encoder. The encoded data is received at an input 82, such as a buffer, and is distributed according to the first bits received. A buffer is required so that the decoding can be fed back to the buffer to designate the number of bits of an encoded token or to indicate the end of the previous encoded token, and thereby indicate the first bits of the next token. One of skill in the art will be able to provide the circuitry and/or logic which is not shown here. The first bit designates whether the token is LZ1 encoded data or is a literal. Thus, a "1" is detected by logic 83 and gates the input to a LZ-1 decoder 84.

If the first bit is a "0", the token is a literal, and is gated to logic 85, which detects the next bit to determine whether the token is from the first MRU group, a "0", or not, a "1". If the bit is a "0", logic 85 gates the token to a selector 86, and if a "1", gates the token to logic 87. Logic 87, in turn, determines whether the token is from the second MRU group, a "0", or from the LRU group, a "1", and gates the token to the appropriate section of the selector 86. Selector 86 employs the token as a location address (hence, it need not be a CAM) of the storage array 80. A storage array read out device 88 then reads the literal from the accessed location in the storage array 80 and provides the decoded output on output 89.

The selector 86 and an incrementor 90 then move the accessed literal to the top of the storage array stack, and increment downward one location in the sequential order, all of the literals in the storage array between and including the one of the literals at the top of the MRU order to the one of said literals in the order immediately preceding the accessed literal. Thus, the literals are arranged in the storage array 80 identically to the arrangement of the literals in the encoding storage array.

Again, one of skill in the art can envision alternative arrangements of the decoder.

Figure 7:
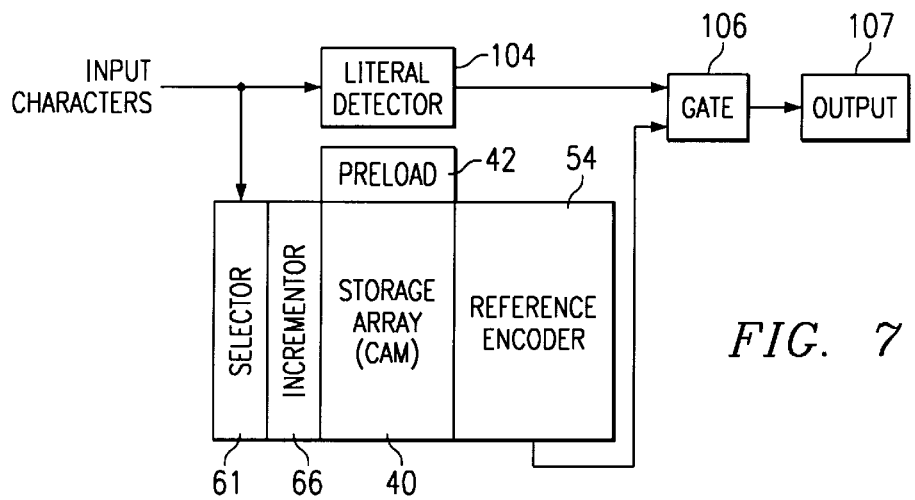
FIG. 7 is a block diagram of another alternative embodiment of a system of the present invention for handling literals.
Figure 8:
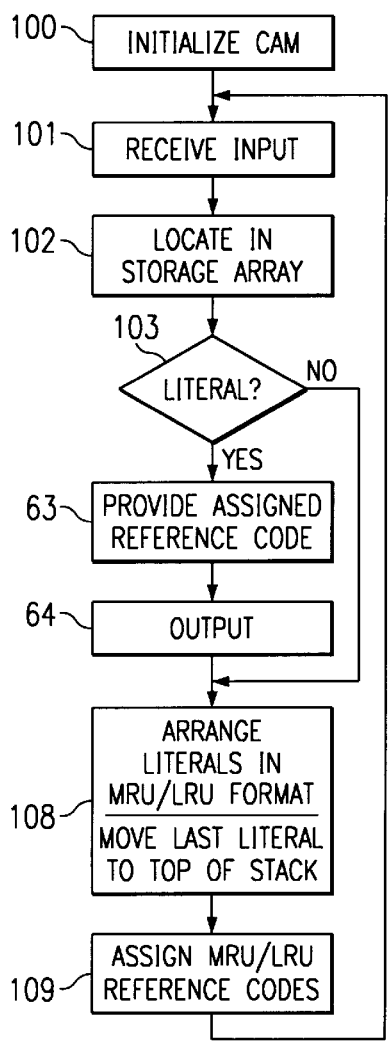
FIG. 8 is a flow chart depicting an alternative method of the present invention for handling literals of the system of FIG. 7.

FIGS. 7 and 8 illustrate another alternative embodiment of the present invention. The function of the embodiment is to update the storage array 40 of FIG. 2 with each input character, rather than only the literals.

Specifically, at step 100, the storage array 40 is initialized with the preload 42. At step 101, the next input is received and, in step 102, the selector 61 employs the bits of the input to locate a corresponding character in the storage array 40. In step 103, the literal identifier is employed by literal detector 104 to identify whether the bits of the input comprise a literal. If "YES", steps 63 employs the reference encoder 54, as above, to provide the reference code of the location. This step is indicated in FIG. 7 by the operation of the gate 106 by the literal detector 104 to gate the reference code to the output sequencer 107, to accomplish output step 64.

However, if the bits are not a literal, "NO" in step 103, gate 106 is not operated by the literal detector 104, blocking the identified reference code. Thus, only the reference codes for literals are passed to the output 107. Then, whether or not a literal was identified, the selector 61 and incrementor 66 rearrange the contents of the storage array in accordance with the input bits in accordance with step 108 so that, in step 109, the reference codes are assigned based on the MRU/LRU of the bits in the combined LZ1 and literal output.

The decoder must similarly rearrange the decoder storage array to accommodate the combined LZ1 and literal output, which can be accomplished by those of skill in the art.

While the preferred embodiments of the present invention have been illustrated in detail, it should be apparent that modifications and adaptations to those embodiments may occur to one skilled in the art without departing from the scope of the present invention as set forth in the following claims.

I claim:

1. In a Lempel-Ziv data compression system, a method for handling literals provided at an input, comprising the steps of:

arranging literals of a defined preload in an MRU/LRU format, said literals comprising all possible combinations of bits representing every possible value for said literals of said defined preload;

assigning shorter MRU/LRU reference codes to said MRU literals and longer MRU/LRU reference codes to said LRU literals;

providing, in response to an input said literal, said assigned MRU/LRU reference code for said literal; and repeating said arranging step.

2. The method of claim 1, wherein said arranging step comprises arranging said literals in a defined sequential MRU/LRU order in said format, and moving each said input literal from its previous location in said order to the top of said MRU order, and incrementing all literals in said sequential order from the top of said MRU order to the one of said literals in said order immediately preceding said selected literal, one location downward in said order.

3. The method of claim 2, wherein said assigning step assigned MRU/LRU reference code is directly related to the displacement of each said literal from said top of said MRU order.

4. In a Lempel-Ziv data compression system, a method for handling literals provided at an input, comprising the steps of:

arranging literals in a defined sequential MRU/LRU order in an MRU/LRU format, and moving each said input literal from its previous location in said order to the top of said MRU order, and incrementing all literals in said sequential order from the top of said MRU order to the one of said literals in said order immediately preceding said selected literal, one location downward in said order;

assigning shorter MRU/LRU reference codes to said MRU literals and longer MRU/LRU reference codes to said LRU literals, comprising assigning a <0> reference code to said MRU literals, and a <1x> reference code to said LRU literals;

providing, in response to an input said literal, said assigned MRU/LRU reference code for said literal; and repeating said arranging step.

5. In a Lempel-Ziv data compression system, a method for handling literals provided at an input, comprising the steps of:

arranging literals in a defined sequential MRU/LRU order in an MRU/LRU format, and moving each said input literal from its previous location in said order to the top of said MRU order, and incrementing all literals in said sequential order from the top of said MRU order to the one of said literals in said order immediately preceding said selected literal, one location downward in said order;

assigning shorter MRU/LRU reference codes to said MRU literals and longer MRU/LRU reference codes to said LRU literals, comprising assigning a <0> reference code leader to a first MRU ¼ of said format, assigning a <10> reference code leader to the next MRU ¼ of said format; and a <11> reference code leader to the LRU ½ of said format, said LRU ½ of said format additionally having one additional reference code bit as compared to said MRU ½ of said format;

providing, in response to an input said literal, said assigned MRU/LRU reference code for said literal; and repeating said arranging step.

6. The method of claim 2, wherein said assigning step additionally comprises substituting said assigned reference code for a portion of each said literal, and the remainder of said literal remains unchanged.

7. The method of claim 2, wherein said literals comprise 8-bit bytes and a literal identifier, and wherein said assigning step comprises assigning shorter MRU/LRU reference codes of 8-bits or less to said MRU literals and assigning longer MRU/LRU reference codes of 9-bits or more to said LRU literals, said assigned reference codes in addition to said literal identifier.

8. In a LemDel-Ziv data compression system, a method for handling literals provided at an input, said literals comprising 8-bit bytes and a literal identifier, comprising the steps of:

arranging literals in a defined sequential MRU/LRU order in an MRU/LRU format, and moving each said input literal from its previous location in said order to the top of said MRU order, and incrementing all literals in said sequential order from the top of said MRU order to the one of said literals in said order immediately preceding said selected literal, one location downward in said order, wherein said MRU/LRU comprises 256 entries, including each possible combination of said 8-bit byte literals;

assigning shorter MRU/LRU reference codes of 8-bits or less to said MRU literals and longer MRU/LRU reference codes of 9-bits or more to said LRU literals, comprising assigning a <0> reference code leader to a first MRU 64 entries of said format, assigning a <10> reference code leader to the next MRU 64 entries of said format; and a <11> reference code leader to the LRU 128 entries of said format, said LRU reference codes of said format additionally having one additional reference code bit as compared to said MRU 128 entries of said format;

providing, in response to an input said literal, said assigned MRU/LRU reference code for said literal; and repeating said arranging step.

9. The method of claim 1, wherein said arranging step additionally comprises an initial step of pre-arranging said literals in a pre-selected MRU/LRU order in said format.

10. In a Lempel-Ziv data compression system, the improvement for handling literals comprising:

an input for receiving said literals;

a storage array for storing said literals, said literals arranged in said storage array in an MRU/LRU order;

a selector coupled to said input and to said storage array, said selector responsive to each said literal received at said input for selecting said literal at said storage array, and for rearranging said order of said literals in said storage array; and a reference encoder coupled to said selector and to said storage array, said reference encoder for assigning reference codes to said literals stored in said storage array, said reference codes based on said MRU/LRU arrangement, said reference encoder responsive to said selection for each said input by said selector for providing an output of said assigned reference code therefor, before said rearrangement of said storage array by said selector.

11. The improvement of claim 10, wherein said selector additionally comprises an incrementor responsive to said literal selection, for incrementing downward one location in said order, all said literals in said storage array from the top of said MRU order to the one of said literals in said order immediately preceding said selected literal, and said selector moves said selected literal to the top of said MRU order.

12. The improvement of claim 11, wherein said reference encoder assigned reference code for each said literal is directly related to the displacement of each said literal from said top of said MRU order.

13. The improvement of claim 11, wherein said reference encoder assigns a <0> reference code to said MRU literals, and a <1x> reference code to said LRU literals.

14. The improvement of claim 11, wherein said storage array comprises a content addressable memory and wherein said selector comprises logic to move said selected literal to the top of said MRU order of said content addressable memory and said incrementor comprises logic to increment said downward incrementing literals.

15. The improvement of claim 11, wherein said reference encoder assigns a <0> reference code leader to a first MRU ¼ of said storage array MRU/LRU order, assigning a <10> reference code leader to the next MRU ¼ of said storage array MRU/LRU order; and a <11> reference code leader to the LRU ½ of said storage array MRU/LRU order, said LRU ½ of said storage array MRU/LRU order additionally having one additional reference code bit as compared to said MRU ½ of said storage array MRU/LRU order.

16. The improvement of claim 11, wherein said reference encoder substitutes said assigned reference code for a portion of each said literal, and the remainder of said literal remains unchanged.

17. The improvement of claim 11, wherein said literals comprise 8-bit bytes and a literal identifier, and wherein said reference encoder assigns shorter MRU/LRU reference codes of 8-bits or less to said MRU literals and assigns longer MRU/LRU reference codes of 9-bits or more to said LRU literals, said assigned reference codes in addition to said literal identifier.

18. The improvement of claim 17, wherein said storage array comprises 256 MRU/LRU entries, including each possible combination of said 8-bit byte literals, and wherein said reference encoder assigns a <0> reference code leader to a first MRU 64 entries of said storage array, assigns a <10> reference code leader to the next MRU 64 entries of said storage array; and a <11> reference code leader to the LRU 128 entries of said storage array, said LRU reference codes additionally having one additional reference code bit as compared to said MRU 128 reference codes.

19. The improvement of claim 10, wherein said storage array is additionally initially pre-arranged with said literals in a pre-selected MRU/LRU arrangement.

* * * * *